(12) United States Patent
Chang et al.

(10) Patent No.: US 6,376,377 B1
(45) Date of Patent: Apr. 23, 2002

(54) POST CHEMICAL MECHANICAL POLISH (CMP) PLANARIZING SUBSTRATE CLEANING METHOD EMPLOYING ENHANCED SUBSTRATE HYDROPHILICITY

(75) Inventors: Weng Chang, Taipei; Ying-Ho Chen, Taipei; Jih-Churng Twu, Hsin-Chu; Syun-Ming Jang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/541,487

(22) Filed: Apr. 3, 2000

(51) Int. Cl.⁷ ............................................. H01L 21/302

(52) U.S. Cl. ..................... 438/689; 438/691; 438/692; 438/697

(58) Field of Search ................................ 438/691, 692, 438/697, 689

(56) References Cited

U.S. PATENT DOCUMENTS

| | | | |
|---|---|---|---|
| 4,492,616 A | * 1/1985 | Pliefke et al. ................. 204/33 |
| 5,051,134 A | 9/1991 | Schnegg et al. ................ 134/3 |
| 5,476,817 A | 12/1995 | Numata ....................... 437/195 |
| 5,770,095 A | 6/1998 | Sasaki et al. ................. 216/38 |
| 5,814,562 A | 9/1998 | Green et al. .................. 438/708 |
| 5,897,379 A | 4/1999 | Ulrich et al. ................. 438/754 |
| 5,952,243 A | * 9/1999 | Forester et al. ............. 438/693 |
| 6,057,251 A | * 5/2000 | Goo et al. .................... 438/788 |
| 6,069,080 A | * 5/2000 | James et al. ................. 438/691 |

* cited by examiner

*Primary Examiner*—Benjamin L. Utech
*Assistant Examiner*—Venessa Perez-Ramos
(74) *Attorney, Agent, or Firm*—George O. Saile; Stephen B. Ackerman; Stephen G. Stanton

(57) ABSTRACT

Within a method for removing from over a substrate a chemical mechanical polish (CMP) residue layer there is first provided a substrate. There is then formed over the substrate: (1) a chemical mechanical polish (CMP) substrate layer having an aperture formed therein; (2) a chemical mechanical polish (CMP) planarized patterned layer formed within the aperture within the chemical mechanical polish (CMP) substrate layer; and (3) a chemical mechanical polish (CMP) residue layer formed upon at least one of the chemical mechanical polish substrate layer and the chemical mechanical polish (CMP) planarized patterned layer, where at least one of the chemical mechanical polish (CMP) substrate layer and the chemical mechanical polish (CMP) planarized patterned layer has a first aqueous contact angle. There is then treated the at least one of the chemical mechanical polish (CMP) substrate layer and the chemical mechanical polish (CMP) planarized patterned layer having the first aqueous contact angle to provide at least one of a hydrophilic chemical mechanical polish (CMP) substrate layer and a hydrophilic chemical mechanical polish (CMP) planarized patterned layer having a second aqueous contact angle less than the first aqueous contact angle. Finally, there is then removed the chemical mechanical polish (CMP) residue layer from the at least one of the hydrophilic chemical mechanical polish (CMP) substrate layer and the hydrophilic chemical mechanical polish (CMP) planarized patterned layer with an aqueous cleaner composition.

19 Claims, 2 Drawing Sheets

POST CHEMICAL MECHANICAL POLISH (CMP) PLANARIZING SUBSTRATE CLEANING METHOD EMPLOYING ENHANCED SUBSTRATE HYDROPHILICITY

BACKGROUND OF THE INVENTION

1. Field of the Invention

The present invention relates generally chemical mechanical polish (CMP) planarizing methods for forming chemical mechanical polish (CMP) planarized layers within microelectronic fabrications. More particularly, the present invention relates to chemical mechanical polish (CMP) planarizing methods for forming residue free chemical mechanical polish (CMP) planarized layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common within the art of microelectronic fabrication to employ when forming patterned microelectronic conductor layers within microelectronic fabrications, such as but not limited to patterned microelectronic conductor contact layers and patterned microelectronic conductor interconnect layers within microelectronic fabrications, copper containing conductor materials. Similarly, it has also become common in the art of microelectronic fabrication to employ interposed between the patterns of patterned microelectronic conductor layers within microelectronic fabrications patterned microelectronic dielectric layers formed of comparatively low dielectric constant dielectric materials, such as, for example and without limitation, organic polymer spin-on-polymer (SOP) low dielectric constant dielectric materials and silsesquioxane spin-on-glass (SOG) low dielectric constant dielectric materials.

Within the context of the present invention, comparatively low dielectric constant dielectric materials are intended as dielectric materials having a dielectric constant less than about 4.0, more preferably from about 2.0 to less than about 4.0, while for comparison purposes, conventional dielectric materials which may be employed within microelectronic fabrications, such conventional dielectric materials including but not limited to silicon oxide dielectric materials, silicon nitride dielectric materials and silicon oxynitride dielectric materials, typically possess comparatively higher dielectric constants greater than about 4.0, and more typically from greater than about 4.0 to about 8.0.

Copper containing conductor materials are desirable for forming patterned microelectronic conductor layers within microelectronic fabrications since copper containing conductor materials typically possess enhanced electrical properties in comparison with other conductor materials, such as but not limited to aluminum containing conductor materials and tungsten containing conductor materials, which may alternatively be employed for forming patterned microelectronic conductor layers within microelectronic fabrications.

Similarly, low dielectric constant dielectric materials are desirable for forming patterned microelectronic dielectric layers interposed between the patterns of patterned microelectronic conductor layers within microelectronic fabrications since such low dielectric constant dielectric materials typically provide microelectronic fabrications with enhanced microelectronic fabrication speed and attenuated patterned microelectronic conductor layer cross-talk.

While copper containing conductor materials and low dielectric constant dielectric materials are thus desirable in the art of microelectronic fabrication for forming patterned microelectronic conductor layers having interposed between their patterns patterned microelectronic dielectric layers within microelectronic fabrications, copper containing conductor materials in general, and more particularly in conjunction with low dielectric constant dielectric materials, are not without problems within the art of microelectronic fabrication for forming patterned microelectronic conductor layers having interposed between their patterns patterned microelectronic dielectric layers within microelectronic fabrications. In that regard, insofar as copper containing conductor materials are often difficult to pattern while employing reactive ion etch (RIE) plasma etch methods as are otherwise conventional for forming patterned microelectronic conductor layers within microelectronic fabrications, such patterned microelectronic conductor layers when formed within microelectronic fabrications of copper containing conductor materials are often formed employing damascene methods, including but not limited to dual damascene methods.

As is understood by a person skilled in the art, within a damascene method a blanket copper containing conductor layer is formed into an aperture formed within a patterned microelectronic layer, where the aperture typically comprises a via and/or trench defined within a patterned microelectronic dielectric layer, and the excess of the blanket copper containing conductor layer above the aperture is planarized while employing a chemical mechanical polish (CMP) planarizing method to form within the aperture a chemical mechanical polish (CMP) planarized patterned copper containing microelectronic conductor layer, such as a chemical mechanical polish (CMP) planarized patterned copper containing microelectronic conductor stud layer and/or a chemical mechanical polish (CMP) planarized patterned copper containing microelectronic conductor interconnect layer within the corresponding via and/or the corresponding trench defined by the patterned microelectronic dielectric layer.

While such chemical mechanical polish (CMP) planarizing methods are thus useful for forming within microelectronic fabrications chemical mechanical polish (CMP) planarized patterned copper containing microelectronic conductor layers within microelectronic fabrications, such chemical mechanical polish (CMP) planarizing methods in turn are also not entirely without problems in the art of microelectronic fabrication for forming chemical mechanical polish (CMP) planarized patterned copper containing microelectronic conductor layers having interposed between their patterns patterned microelectronic dielectric layers, such as but not limited to patterned low dielectric constant microelectronic dielectric layers, within microelectronic fabrications. In that regard, it is also known in the art of microelectronic fabrication that a patterned copper containing microelectronic conductor layer, when formed employing a chemical mechanical polish (CMP) planarizing method, is often formed while providing a chemical mechanical polish (CMP) residue layer upon at least a portion of the microelectronic fabrication adjoining the patterned copper containing microelectronic conductor layer. Such a chemical mechanical polish (CMP) residue layer is in turn undesirable in the art of microelectronic fabrication since it often compromises the functionality or reliability of the microelectronic fabrication within which it is formed.

It is thus towards the goal of forming within the art of microelectronic fabrication microelectronic fabrications having formed therein chemical mechanical polish (CMP) planarized patterned copper containing conductor layers having interposed between their patterns patterned low dielectric constant dielectric layers, such as but not limited to chemical mechanical polish (CMP) planarized patterned copper containing conductor stud layers and chemical mechanical polish (CMP) planarized patterned copper containing conductor interconnect layers, having formed interposed between their patterns organic polymer spin-on-polymer (SOP) low dielectric constant patterned dielectric layers and silsesquioxane spin-on-glass (SOG) low dielectric constant patterned dielectric layers, absent chemical mechanical polish (CMP) residue layers formed within the microelectronic fabrication, that the present invention is most specifically directed. In a more general sense, the present invention is also directed towards forming within the art of microelectronic fabrication microelectronic fabrications having formed therein chemical mechanical polish (CMP) planarized patterned microelectronic layers absent chemical mechanical polish (CMP) residue layers formed within the microelectronic fabrications.

Various methods and materials have been disclosed in the art of microelectronic fabrication for forming microelectronic fabrications and microelectronic layers with desirable properties within the art of microelectronic fabrication.

For example, Schnegg et al., in U.S. Pat. No. 5,051,134, disclose a method for treating a silicon semiconductor substrate employed within an integrated circuit microelectronic fabrication with an aqueous hydrofluoric acid solution in a fashion such that there is attenuated an increase in particulate contamination upon the silicon semiconductor substrate when treating the silicon semiconductor substrate with the aqueous hydrofluoric acid solution. The method includes, when treating the silicon semiconductor substrate with the aqueous hydrofluoric acid solution, incorporating an additive into the aqueous hydrofluoric acid solution, where the additive is selected from the group consisting of at least one of: (1) an organic compound capable of forming an inclusion compound; and (2) an acid which in addition to not oxidizing the silicon semiconductor substrate also has a pKa of less than 3.14.

In addition, Humata, in U.S. Pat. No. 5,476,817, discloses a method for forming within a microelectronic fabrication a patterned conductor lead layer structure having formed therein a patterned conductor lead layer having formed interposed between its patterns a patterned low dielectric constant dielectric layer, where the patterned conductor lead layer structure has an attenuated susceptibility to joule heating, thus providing the microelectronic fabrication with an enhanced reliability. The method realizes the foregoing objects by employing when fabricating the patterned conductor lead layer structure within the microelectronic fabrication a thermally conductive electrical insulator material which dissipates heat from the patterned conductor lead layer within the patterned conductor lead layer structure to a dummy conductor lead layer within the pattern ed conductor lead layer structure.

Further, Sasaki et al., in U.S. Pat. No. 5,770,095, disclose a chemical mechanical polish (CMP) planarizing method and a chemical mechanical polish (CMP) slurry composition for use when forming from a blanket conductor layer within a microelectronic fabrication a chemical mechanical polish (CMP) planarized patterned conductor layer within the microelectronic fabrication, where the chemical mechanical polish (CMP) planarized patterned conductor layer is formed with attenuated dishing within the chemical mechanical polish (CMP) planarized patterned conductor layer. The chemical mechanical polish (CMP) planarizing method and the chemical mechanical polish (CMP) slurry composition realize the foregoing objects by incorporating into the chemical mechanical polish (CMP) slurry composition employed within the chemical mechanical polish (CMP) planarizing method in addition to a chemical mechanical polish (CMP) etching agent a chemical mechanical polish (CMP) protective film forming agent.

Still further, Green et al., in U.S. Pat. No. 5,814,562, disclose a method for cleaning a silicon semiconductor substrate employed within an integrated circuit microelectronic fabrication such that there may be formed incident to thermal oxidation of the silicon semiconductor substrate a thermal silicon oxide layer with enhanced electrical properties for use within the integrated circuit microelectronic fabrication. The method realizes the foregoing object by employing within the method: (1) a first treatment of the silicon semiconductor substrate with a vapor mixture of anhydrous hydrofluoric acid and methanol in a nitrogen carrier gas, followed by; (2) a second treatment of the silicon semiconductor substrate with a chlorine gas which has been irradiated with broadband ultraviolet radiation.

Finally, Ulrich et al., in U.S. Pat. No. 5,897,379, disclose a method for selectively removing from only edge portions of a substrate employed within a microelectronic fabrication portions of a blanket copper containing layer formed over the substrate employed within the microelectronic fabrication, while not oxidizing remaining portions of the blanket copper containing layer formed over non-edge portions of the substrate. The method employs a masking of selected central portions of the blanket copper containing layer formed over the substrate and a subsequent wet chemical etching of the unmasked portions of the blanket copper containing layer at the edge portions of the substrate.

Desirable in the art of microelectronic fabrication are additional methods and materials which may be employed for forming within microelectronic fabrications chemical mechanical polish (CMP) planarized patterned copper containing conductor layers having formed interposed between their patterns patterned low dielectric constant dielectric layers with attenuated chemical mechanical polish (CMP) planarizing residue formation within the microelectronic fabrications. More generally desirable in the art of microelectronic fabrication are additional methods and materials which may be employed for forming within microelectronic fabrication residue free chemical mechanical polish (CMP) planarized patterned layers within microelectronic fabrications.

It is towards the foregoing objects that the present invention is both specifically and more generally directed.

SUMMARY OF THE INVENTION

A first object of the present invention is to provide a method for forming a residue free chemical mechanical polish (CMP) planarized patterned layer within a microelectronic fabrication.

A second object of the present invention is to provide a method in accord with the first object of the present invention, where the chemical mechanical polish (CMP) planarized patterned layer is a chemical mechanical polish (CMP) planarized patterned copper containing conductor layer formed into an aperture defined by a pair of patterned low dielectric constant dielectric layers within the microelectronic fabrication.

A third object of the present invention is to provide a method in accord with the first object of the present invention and the second object of the present invention, which method is readily commercially implemented.

In accord with the objects of the present invention, there is provided a method for removing from over a substrate a chemical mechanical polish (CMP) residue layer. To practice the method of the present invention, there is first provided a substrate. There is then formed over the substrate: (1) a chemical mechanical polish (CMP) substrate layer having an aperture formed therein; (2) a chemical mechanical polish (CMP) planarized patterned layer formed within the aperture within the chemical mechanical polish (CMP) substrate layer; and (3) a chemical mechanical polish (CMP) residue layer formed upon at least one of the chemical mechanical polish (CMP) substrate layer and the chemical mechanical polish (CMP) planarized patterned layer, where the at least one of the chemical mechanical polish (CMP) substrate layer and the chemical mechanical polish (CMP) planarized patterned layer has a first aqueous contact angle. There is then treated the at least one of the chemical mechanical polish (CMP) substrate layer and the chemical mechanical polish (CMP) planarized patterned layer having the first aqueous contact angle to provide at least one of a hydrophilic chemical mechanical polish (CMP) substrate layer and a hydrophilic chemical mechanical polish (CMP) planarized patterned layer having a second aqueous contact angle less than the first aqueous contact angle. Finally, there is then removed the chemical mechanical polish (CMP) residue layer from the at least one of the hydrophilic chemical mechanical polish (CMP) substrate layer and the hydrophilic chemical mechanical polish (CMP) planarized patterned layer with an aqueous cleaner composition.

There is provided by the present invention a method for forming a residue free chemical mechanical polish (CMP) planarized patterned layer within a microelectronic fabrication. The present invention realizes the foregoing object by treating at least one of a chemical mechanical polish (CMP) substrate layer and a chemical mechanical polish (CMP) planarized patterned layer, at least either having formed thereupon a chemical mechanical polish (CMP) residue layer, to form at least one of a corresponding hydrophilic chemical mechanical polish (CMP) substrate layer and a corresponding hydrophilic chemical mechanical polish (CMP) planarized patterned layer, at least either having formed thereupon the chemical mechanical polish (CMP) residue layer, prior to removing therefrom with an aqueous cleaner composition the chemical mechanical polish (CMP) residue layer.

The present invention may be employed where the chemical mechanical polish (CMP) planarized patterned layer is a chemical mechanical polish (CMP) planarized patterned copper containing conductor layer formed into an aperture defined by a pair of low dielectric constant patterned dielectric layers which comprise a chemical mechanical polish (CMP) substrate layer within the microelectronic fabrication. The present invention does not discriminate with respect to the nature of the chemical mechanical polish (CMP) substrate layer and the chemical mechanical polish (CMP) planarized patterned layer provided that at least one of the chemical mechanical polish (CMP) substrate layer and the chemical mechanical polish (CMP) planarized patterned layer: (1) has formed thereupon a chemical mechanical polish (CMP) residue layer; and (2) is also susceptible to being treated such that there is formed at least one of a corresponding hydrophilic chemical mechanical polish (CMP) substrate layer and a corresponding hydrophilic chemical mechanical polish (CMP) planarized patterned layer having a second aqueous contact angle less than a first aqueous contact angle of at least one of the corresponding chemical mechanical polish (CMP) substrate layer and the corresponding chemical mechanical polish (CMP) planarized patterned layer.

The method of the present invention is readily commercially implemented. The present invention employs methods and materials which although reasonably accessible and generally available within fields not necessarily related to the present invention may nonetheless be readily adapted to provide the present invention. Since it is thus a process control, materials selection and materials application which provides at least in part the present invention, rather than exclusively the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
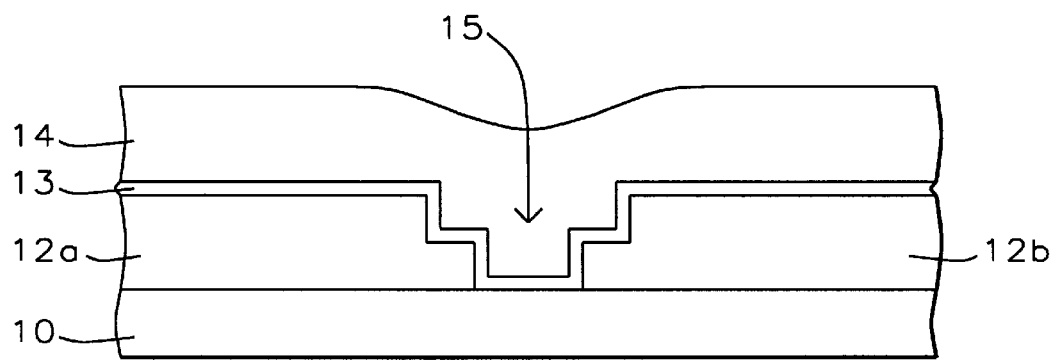
FIG. 1, FIG. 2, FIG. 3 and FIG. 4 show a series of schematic cross-sectional diagrams illustrating the results of progressive stages in forming within a microelectronic fabrication in accord with a preferred embodiment of the present invention a residue free chemical mechanical polish (CMP) planarized patterned conductor layer within the microelectronic fabrication.

The present invention provides a method for forming a residue free chemical mechanical polish (CMP) planarized patterned layer within a microelectronic fabrication. The present invention realizes the foregoing object by employing after forming a chemical mechanical polish (CMP) patterned layer within an aperture with\hin a chemical mechanical polish substrate layer within a microelectronic, where at least one of the chemical mechanical polish (CMP) planarized patterned layer and the chemical mechanical polish (CMP) substrate layer has a chemical mechanical polish (CMP) residue layer formed thereupon, a treating of the at least one of the chemical mechanical polish (CMP) patterned layer and the chemical mechanical polish (CMP) substrate layer to form at least one of a corresponding hydrophilic chemical mechanical polish (CMP) planarized patterned layer and a corresponding hydrophilic chemical mechanical polish (CMP) substrate layer having the chemical mechanical polish (CMP) residue layer formed thereupon prior to removing from the at least one of the hydrophilic chemical mechanical polish (CMP) substrate layer and the hydrophilic chemical mechanical polish (CMP) planarized patterned layer the chemical mechanical polish (CMP) residue layer while employing an aqueous cleaner composition. Within the present invention, the at least one of the chemical mechanical polish (CMP) substrate layer and the chemical mechanical polish (CMP) planarized patterned layer has a first aqueous contact angle greater than a second aqueous contact angle of the corresponding at least one of the hydrophilic chemical mechanical polish (CMP) substrate layer and hydrophilic chemical mechanical polish (CMP) planarized patterned layer.

Although the preferred embodiment of the present invention illustrates the present invention within the context of removing from a pair of chemical mechanical polish (CMP) patterned dielectric substrate layers a pair of chemical mechanical polish (CMP) residue layers formed incident to forming while employing a chemical mechanical polish (CMP) planarizing method a chemical mechanical polish (CMP) planarized patterned conductor layer into an aperture defined by the pair of chemical mechanical polish (CMP) patterned dielectric substrate layers, the present invention may in general be employed for removing from at least one of a chemical mechanical polish (CMP) substrate layer and a chemical mechanical polish (CMP) planarized patterned layer a chemical mechanical polish (CMP) residue layer, where each of the chemical mechanical polish (CMP) substrate layer and the chemical mechanical polish (CMP) planarized patterned layer may independently be formed of a microelectronic material selected from the group including but not limited to microelectronic conductor materials, microelectronic semiconductor materials and microelectronic dielectric materials.

Similarly, the present invention may be employed for removing from at least one of a chemical mechanical polish (CMP) substrate layer and a chemical mechanical polish (CMP) planarized patterned layer a chemical mechanical polish (CMP) residue layer formed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages in forming within a microelectronic fabrication in accord with a preferred embodiment of the present invention a residue free chemical mechanical polish (CMP) planarized patterned conductor layer within the microelectronic fabrication. Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed thereupon a pair of patterned dielectric layers 12a and 12b which define an aperture 15. There is similarly also shown within FIG. 1 a blanket barrier layer 13 formed conformally upon the patterned dielectric layers 12a and 12b and an exposed portion of the substrate 10 within the aperture 15, while not completely filling the aperture 15, where the blanket barrier layer 13 in turn has formed thereupon a blanket conductor layer 14 which does completely fill the aperture 15.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may comprise a substrate alone as employed within the microelectronic fabrication, or in the alternative, the substrate 10 may comprise the substrate as employed within the microelectronic fabrication, where the substrate has formed thereupon and/or thereover, and thus incorporated therein, any of several additional microelectronic layers as are conventional within the microelectronic fabrication within which is employed the substrate. Similarly with the substrate alone, such additional microelectronic layers may independently be formed of microelectronic materials selected from the group including but not limited to microelectronic conductor materials, microelectronic semiconductor materials and microelectronic dielectric materials.

Similarly, although also not specifically illustrated within the schematic cross-sectional diagram of FIG. 1, the substrate 10, particularly but not exclusively when the substrate 10 comprises a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to resistors, transistors, diodes and capacitors.

Within the preferred embodiment of the present invention with respect to the pair of patterned dielectric layers 12a and 12b, although the pair of patterned dielectric layers 12a and 12b may be formed of dielectric materials as are conventional in the art of microelectronic fabrication, including but not limited to silicon oxide dielectric materials, silicon nitride dielectric materials, silicon oxynitride materials, spin-on-glass (SOG) low dielectric constant dielectric materials and spin-on-polymer (SOP) low dielectric constant dielectric materials, as well as composites thereof and laminates thereof, the upper surfaces of the pair of patterned dielectric layers 12a and 12b typically have a first deionized water sessile aqueous contact angle of greater than about 90 degrees, more typically and preferably from about 100 to about 160 degrees. In order to provide a first deionized water sessile aqueous contact angle in such a range, and to provide the microelectronic fabrication whose schematic cross-sectional diagram is illustrated in FIG. 1 with desirable electrical properties, the dielectric material from which is formed the upper surfaces of the pair of patterned dielectric layers 12a and 12b will typically and preferably have contained therein organo functionality, fluoro functionality or both organo functionality and fluoro functionality. More typically and preferably, the upper surfaces of each of the patterned dielectric layers 12a and 12b is formed of a low dielectric constant organic polymer spin-on-polymer (SOP) dielectric material, such as but not limited to a poly arylene ether (PAE) organic polymer spin-on-polymer (SOP) dielectric material, a fluorinated poly arylene ether (PAE) organic polymer spin-on-polymer (SOP) dielectric material, a polyimide organic polymer spin-on-polymer (SOP) dielectric material or a fluorinated polyimide organic polymer spin-on-polymer (SOP) dielectric material, although other dielectric materials, such as but not limited to low dielectric constant organo functional and/or fluoro functional silsesquioxane spin-on-glass (SOG) materials and organo and/or fluoro functional chemical vapor deposited (CVD) dielectric materials may also be employed for forming the upper surfaces of each of the patterned dielectric layers 12a and 12b.

For the preferred embodiment of the present invention, the pair of patterned dielectric layers 12a and 12b typically comprises a laminate or composite of the foregoing dielectric materials formed in a fashion such that the aperture 15 is formed with: (1) a lower portion which defines a via which accesses the substrate 10; and (2) an upper portion of areal dimensions larger than and overlapping the via, the upper portion in turn defining a trench contiguous with the via. Typically and preferably: (1) the pair of patterned dielectric layers 12a and 12b is formed to a thickness of from about 2000 to about 15000 angstroms; (2) the via defined by the lower portion of the pair of patterned dielectric layers 12a and 12b is formed with a maximum aperture width of from about 0.18 to about 0.45 microns; and (3) the trench defined by the upper portion of the pair of patterned dielectric layers 12a and 12b is formed with a minimum aperture width of from about 0.18 to about 0.80 microns.

Within the preferred embodiment of the present invention with respect to the blanket barrier layer 13, the blanket barrier layer 13 is generally optional within the present invention but preferably included within the preferred embodiment of the present invention. The blanket barrier layer 13 may be formed of barrier materials as are conventional in the art of microelectronic fabrication, such barrier materials including but not limited to titanium, titanium nitride, tantalum, tantalum nitride, tungsten and tungsten nitride barrier materials, as well as laminates thereof and composites thereof Typically and preferably, the blanket barrier layer 13 may be formed from any of the foregoing barrier materials, formed conformally to a thickness of from about 100 to about 800 angstroms upon the pair of patterned dielectric layers 12a and 12b and portions of the substrate 10 exposed at the bottom of the via 15, while not completely filling the via 15.

Finally, within the preferred embodiment of the present invention with respect to the blanket conductor layer 14, the blanket conductor layer 14 may be formed of conductor materials as are conventional in the art of microelectronic fabrication, such conductor materials including but not limited to aluminum, aluminum alloy, copper and copper alloys conductor materials. More preferably, within the preferred embodiment of the present invention, the blanket conductor layer 14 is formed of a copper containing conductor material, preferably having a copper content of at least about 90 percent. Typically and preferably the blanket conductor layer 14 is formed of the copper containing conductor material formed to a thickness of from about 5000 to about 20000 angstroms upon the blanket barrier layer 13 and completely filling the aperture 15.

Figure 2:
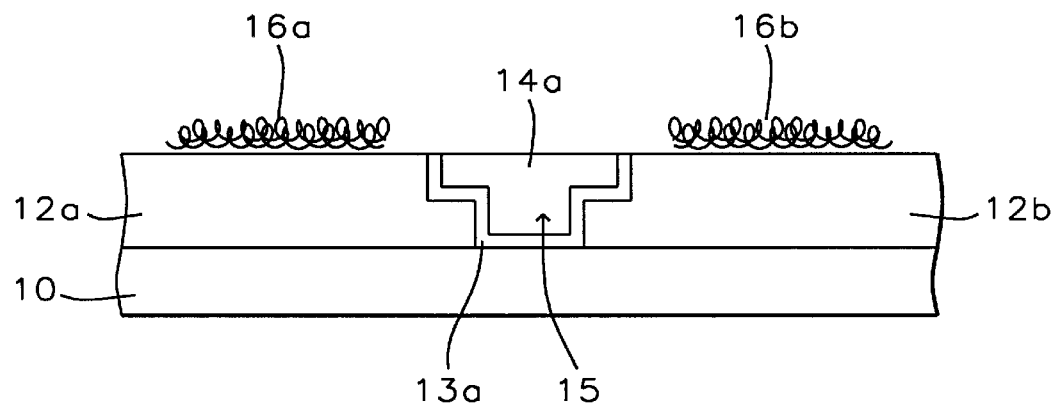

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket conductor layer 14 and the blanket barrier layer 13 have been chemical mechanical polish (CMP) planarized to form a corresponding chemical mechanical polish (CMP) planarized patterned conductor layer 14a formed upon a corresponding patterned barrier layer 13a within the aperture 15, while simultaneously forming a pair of chemical mechanical polish (CMP) residue layers 16a and 16b upon the corresponding patterned dielectric layers 12a and 12b.

Within the preferred embodiment of the present invention with respect to the chemical mechanical polish (CMP) planarizing method which is employed for forming from the blanket conductor layer 14 and the blanket barrier layer 13 the corresponding chemical mechanical polish (CMP) planarized patterned conductor layer 14a and the corresponding patterned barrier layer 13a when the blanket conductor layer 14 is formed of a copper containing conductor material, the chemical mechanical polish (CMP) planarizing method typically and preferably employs an aqueous slurry composition comprising a silica abrasive, along with a potassium permanganate oxidizing agent. Typically and preferably, when chemical mechanical polish (CMP) planarizing the blanket conductor layer 14 and the blanket barrier layer 13 to form the corresponding chemical mechanical polish (CMP) planarized patterned conductor layer 14a (when formed of the copper containing conductor material) and the corresponding patterned barrier layer 13a within the aperture 15 as formed upon an eight inch diameter substrate 10, the chemical mechanical polish (CMP) planarizing method also employs: (1) a platen pressure of from about 3 to about 6 pounds per square inch (psi); (2) a head rotation speed of from about 5 to about 40 revolutions per minute (rpm); (3) a platen counter-rotation speed of from about 30 to about 60 revolutions per minute (rpm); (4) a substrate 10 temperature of from about 22 to about 30 degrees centigrade; (5) a silica concentration of from about 8 to about 15 weight percent and a potassium permanganate concentration of from about 8 to about 15 weight percent within the aqueous slurry composition; and (6) a slurry feed rate of about 100 to about 400 cubic centimeters per minute (ccm).

Within the preferred embodiment of the present invention with respect to the pair of chemical mechanical polish (CMP) residue layers 16a and 16b, the pair of chemical mechanical polish (CMP) residue layers 16a and 16btypically and preferably comprises: (1) residual copper containing conductor material derived from the copper containing conductor material from which is formed the blanket conductor layer 14 when formed of the copper containing conductor material, along with; (2) residual barrier material derived from the barrier material from which is formed the blanket barrier layer 13, along with; (3) residual slurry material from the slurry composition which is employed within the chemical mechanical polish (CMP) planarizing method for forming from the blanket conductor layer 14 and the blanket barrier layer 13 the corresponding chemical mechanical polish (CMP) planarized patterned conductor layer 14a and the corresponding patterned barrier layer 13a.

Figure 3:
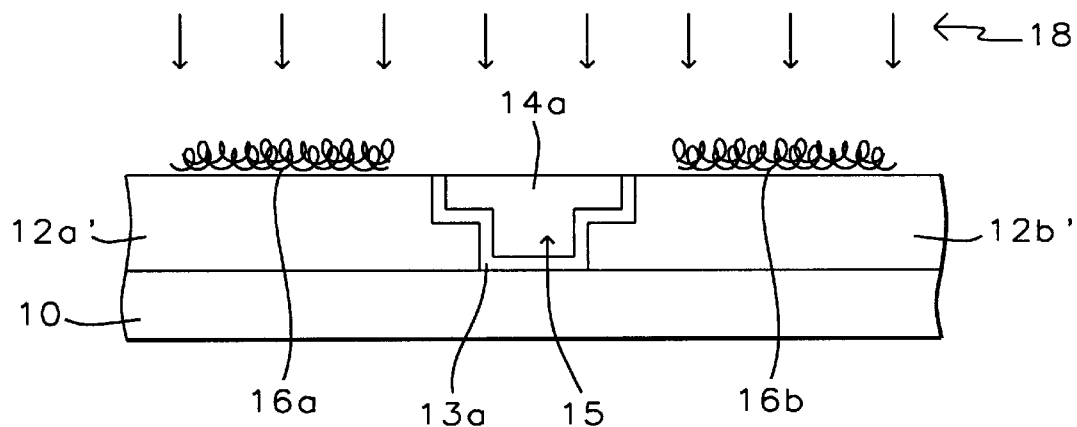

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the pair of patterned dielectric layers 12a and 12b has been treated with a radiation treatment 18 to form from the pair of patterned dielectric layers 12a and 12b a pair of hydrophilic patterned dielectric layers 12a' and 12b'. Within the preferred embodiment of the present invention, it is believed that the radiation treatment 18, which is undertaken within an oxidizing atmosphere, provides for a surface oxidation of the pair of patterned dielectric layers 12a and 12b when having an organic functionality contained therein to provide the hydrophilic patterned dielectric layers 12a' and 12b' having an oxidized organic functionality which exhibit a second deionized water sessile aqueous contact angle of less than about 90 degrees, more preferably from about 30 to about 60 degrees. Although not specifically illustrated within the schematic cross-sectional diagram of FIG. 3, it is also anticipated that the radiation treatment 18 within the oxidizing atmosphere may also oxidize the chemical mechanical polish (CMP) planarized patterned conductor layer 14a to form an oxidized chemical mechanical polish (CMP)

planarized patterned conductor layer which is a hydrophilic chemical mechanical polish (CMP) planarized patterned conductor layer in a manner analogous or equivalent to the manner in which the radiation treatment 18 within the oxidizing atmosphere oxidizes the patterned dielectric layers 12a and 12b to form the hydrophilic patterned dielectric layers 12a' and 12b'.

Within the preferred embodiment of the present invention, the radiation treatment 18 employs: (1) a reactor chamber pressure of from about 700 to about 760 torr; (2) a substrate 10 temperature of from about 200 to about 270 degrees centigrade; (3) a flood exposure ultraviolet exposure employing a mercury lamp having a wattage of from about 580 to about 650 watts all of which radiant energy is reflected onto the surface of an eight inch diameter substrate 10; (4) an oxygen ambient environment of from about 15 to about 25 volume percent in a nitrogen carrier gas; and (5) a radiation exposure time period of from about 0.5 to about 3 minutes.

While the preferred embodiment of the present invention illustrates the present invention within the context of an ultraviolet radiation treatment 18 within an oxygen oxidizing atmosphere, in a more general sense, the present invention may also employ other radiation treatments, such as but not limited to plasma radiation treatments, electron radiation treatments and ion radiation treatments, within oxidizing atmospheres including but not limited to oxygen oxidizing atmospheres, ozone oxidizing atmospheres, nitrous oxide oxidizing atmospheres and nitric oxide oxidizing atmospheres, to effect a similar result when forming from the pair of patterned dielectric layers 12a and 12b as illustrated within the schematic cross-sectional diagram of FIG. 2 the pair of hydrophilic patterned dielectric layers 12a' and 12b' as illustrated within the schematic cross-sectional diagram of FIG. 3.

Similarly, in even a more general sense, and as is noted above, the present invention is most generally directed towards treating at least one of a chemical mechanical polish (CMP) substrate layer and a chemical mechanical polish (CMP) planarized patterned layer having formed thereupon a chemical mechanical polish (CMP) residue layer in an appropriate manner to form therefrom at least one of a corresponding comparatively more hydrophilic chemical mechanical polish (CMP) substrate layer and a corresponding comparatively more hydrophilic chemical mechanical polish (CMP) planarized patterned layer having the chemical mechanical polish (CMP) residue layer formed thereupon, such that the chemical mechanical polish (CMP) residue layer may subsequently be more readily removed therefrom while employing an aqueous cleaner composition.

Figure 4:
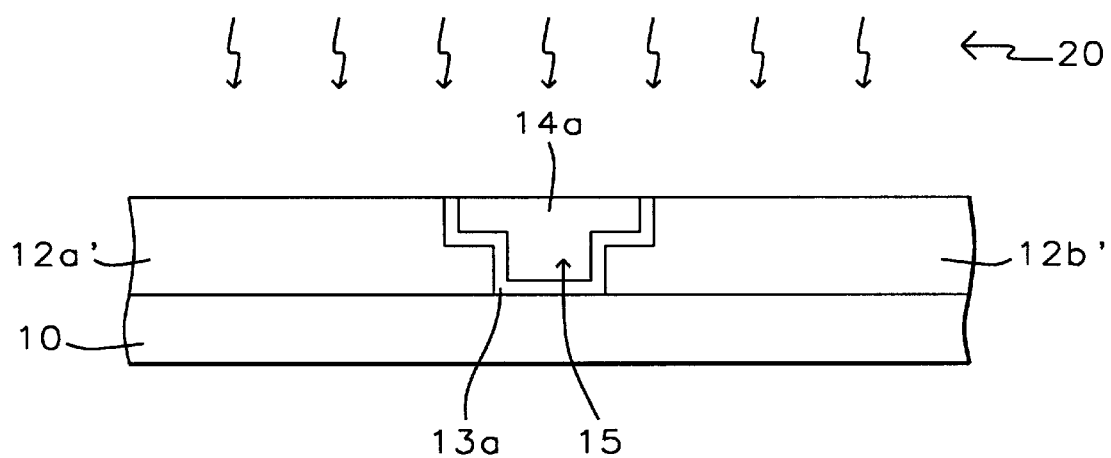

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the chemical mechanical polish (CMP) residue layers 16a and 16b have been stripped from the corresponding hydrophilic patterned dielectric layers 12a' and 12b' through treatment of the microelectronic fabrication whose schematic cross-sectional diagram is illustrated in FIG. 4 with an aqueous cleaner composition 20.

Within the preferred embodiment of the present invention, the aqueous cleaner composition 20 typically and preferably, although not exclusively, comprises an aqueous solution comprising an acid, preferably an organic acid such as but not limited to acetic acid or citric acid, at a temperature of from about 22 to about 30 degrees centigrade for a time period of from about 1 to about 3 minutes, although other aqueous cleaner compositions may also be employed within the present invention, including but not limited to inorganic acidic aqueous cleaner compositions, neutral aqueous cleaner compositions and basic aqueous cleaner compositions, any of which aqueous cleaner compositions may also comprise additives as are conventional in the art of microelectronic fabrication, such additives including but not limited to anionic surfactants, cationic surfactants, neutral surfactants and amphoteric surfactants. In conjunction with the aqueous cleaner composition 20, there may also optionally be employed within the preferred embodiment of the present invention extrinsic activation, such as but not limited to ultrasonic activation, megasonic activation or brush scrubbing, to form from the microelectronic fabrication whose schematic cross-sectional diagram is illustrated in FIG. 3 the microelectronic fabrication whose schematic cross-sectional diagram is illustrated in FIG. 4.

Upon forming the microelectronic fabrication whose schematic cross-sectional diagram is illustrated in FIG. 4, there is formed a microelectronic fabrication having formed therein a residue free chemical mechanical polish (CMP) planarized patterned conductor layer. The residue free chemical mechanical polish (CMP) planarized patterned conductor layer is formed employing a sequential cleaning method employing: (1) a radiation treatment of a pair of patterned dielectric layers having a pair of chemical mechanical polish (CMP) residue layers formed thereupon to form therefrom a pair of hydrophilic patterned dielectric layers having the pair of chemical mechanical polish (CMP) residue layers formed thereupon, where the pair of patterned dielectric layers has a first deionized water sessile aqueous contact angle greater than a second deionized water sessile aqueous contact angle of the pair of hydrophilic patterned dielectric layers followed by; (2) removing the pair of chemical mechanical polish (CMP) residue layers with an aqueous cleaner composition.

As is understood by a person skilled in the art, the preferred embodiment of the present invention is illustrative of the present invention rather than limiting of the present invention. Revisions and modifications may be made to methods, materials, structures and dimensions through which is provided the preferred embodiment of the present invention while still providing embodiments which are within the spirit and scope of the present invention, in accord with the appended claims.

What is claimed is:

1. A method for removing from over a substrate a chemical mechanical polish (CMP) residue layer comprising:
   providing a substrate;
   forming over the substrate:
   a chemical mechanical polish (CMP) substrate layer having an aperture formed therein;
   a chemical mechanical polish (CMP) planarized patterned layer formed within the aperture within the chemical mechanical polish (CMP) substrate layer; and
   a chemical mechanical polish (CMP) residue layer formed upon at least one of the chemical mechanical polish (CMP) substrate layer and the chemical mechanical polish (CMP) planarized patterned layer, where at least one of the chemical mechanical polish (CMP) substrate layer and the chemical mechanical polish (CMP) planarized patterned layer has a first aqueous contact angle;

treating the at least one of the chemical mechanical polish (CMP) substrate layer and the chemical mechanical polish (CMP) planarized patterned layer having the first aqueous contact angle to form at least one of a hydrophilic chemical mechanical polish (CMP) substrate layer and a hydrophilic chemical mechanical polish (CMP) planarized patterned layer having a second aqueous contact angle less than the first aqueous contact angle; and removing the chemical mechanical polish (CMP) residue layer from the at least one of the hydrophilic chemical mechanical polish (CMP) substrate layer and the hydrophilic chemical mechanical polish (CMP) planarized patterned layer with an aqueous cleaner composition.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the chemical mechanical polish (CMP) substrate layer is formed from a microelectronic material selected from the group consisting of microelectronic conductor materials, microelectronic semiconductor materials and microelectronic dielectric materials.

4. The method of claim 1 wherein the chemical mechanical polish (CMP) planarized patterned layer is formed from a microelectronic material selected from the group consisting of microelectronic conductor materials, microelectronic semiconductor materials and microelectronic dielectric materials.

5. The method of claim 1 wherein the at least one of the hydrophilic chemical mechanical polish (CMP) substrate layer and the hydrophilic chemical mechanical polish (CMP) planarized patterned layer is formed incident to a radiation treatment of the at least one of the chemical mechanical polish (CMP) substrate layer and the chemical mechanical polish (CMP) planarized patterned layer within an oxidizing atmosphere.

6. The method of claim 1 wherein first aqueous contact angle is a first deionized water sessile aqueous contact angle of greater than about 90 degrees and the second aqueous contact angle is a second deionized water sessile aqueous contact angle of less than about 90 degrees.

7. A method for forming a chemical mechanical polish (CMP) planarized patterned conductor layer comprising:

providing a substrate;

forming over the substrate:

a chemical mechanical polish (CMP) dielectric substrate layer having an aperture formed therein;

a chemical mechanical polish (CMP) planarized patterned conductor layer formed within the aperture within the chemical mechanical polish (CMP) dielectric substrate layer; and a chemical mechanical polish (CMP) residue layer formed upon at least one of the chemical mechanical polish (CMP) dielectric substrate layer and the chemical mechanical polish (CMP) planarized patterned conductor layer, where at least one of the chemical mechanical polish (CMP) dielectric substrate layer and the chemical mechanical polish (CMP) planarized patterned conductor layer has a first aqueous contact angle;

treating the at least one of the chemical mechanical polish (CMP) dielectric substrate layer and the chemical mechanical polish (CMP) planarized patterned conductor layer having the first aqueous contact angle to provide at least one of a hydrophilic chemical mechanical polish (CMP) dielectric substrate layer and a hydrophilic chemical mechanical polish (CMP) planarized patterned conductor layer having a second aqueous contact angle less than the first aqueous contact angle; and removing the chemical mechanical polish (CMP) residue layer from the at least one of the hydrophilic chemical mechanical polish (CMP) dielectric substrate layer and the hydrophilic chemical mechanical polish (CMP) planarized patterned conductor layer with an aqueous cleaner composition.

8. The method of claim 7 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

9. The method of claim 7 wherein the chemical mechanical polish (CMP) dielectric substrate layer is formed from a microelectronic dielectric material selected from the group consisting of organo functional chemical vapor deposited (CVD) dielectric materials, organo functional spin-on-glass (SOG) dielectric materials and organo functional spin-on-polymer (SOP) dielectric materials.

10. The method of claim 7 wherein the chemical mechanical polish (CMP) planarized patterned conductor layer is formed from a microelectronic conductor material selected from the group consisting of aluminum, aluminum alloys, copper and copper alloys.

11. The method of claim 7 wherein the at least one of the hydrophilic chemical mechanical polish (CMP) dielectric substrate layer and the hydrophilic chemical mechanical polish (CMP) planarized patterned conductor layer is formed incident to a radiation treatment of the at least one of the chemical mechanical polish (CMP) dielectric substrate layer and the chemical mechanical polish (CMP) planarized patterned conductor layer within an oxidizing atmosphere.

12. The method of claim 7 wherein first aqueous contact angle is a first deionized water sessile aqueous contact angle of greater than about 90 degrees and the second aqueous contact angle is a second deionized water sessile aqueous contact angle of less than about 90 degrees.

13. A method for forming a chemical mechanical polish (CMP) planarized patterned conductor layer comprising:

providing a substrate;

forming over the substrate:

a chemical mechanical polish (CMP) low dielectric constant dielectric substrate layer having an aperture formed therein;

a chemical mechanical polish (CMP) planarized patterned conductor layer formed within the aperture within the chemical mechanical polish (CMP) low dielectric constant dielectric substrate layer; and a chemical mechanical polish (CMP) residue layer formed upon at least one of the chemical mechanical polish (CMP) low dielectric constant dielectric substrate layer and the chemical mechanical polish (CMP) planarized patterned conductor layer, where at least one of the chemical mechanical polish (CMP) low dielectric constant dielectric substrate layer and the chemical mechanical polish (CMP) planarized patterned conductor layer has a first aqueous contact angle;

treating the at least one of the chemical mechanical polish (CMP) low dielectric constant dielectric substrate layer and the chemical mechanical polish (CMP) planarized patterned conductor layer having the first aqueous contact angle to provide at least one of a hydrophilic chemical mechanical polish (CMP) low dielectric constant dielectric substrate layer and a hydrophilic chemical mechanical polish (CMP) planarized patterned conductor layer having a second aqueous contact angle less than the first aqueous contact angle; and removing the chemical mechanical polish (CMP) residue layer from the at least one of the hydrophilic chemical mechanical polish (CMP) low dielectric constant dielectric substrate layer and the hydrophilic chemical mechanical polish (CMP) planarized patterned conductor layer with an aqueous cleaner composition.

14. The method of claim 13 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

15. The method of claim 13 wherein the chemical mechanical polish (CMP) low dielectric constant dielectric substrate layer is formed from a low dielectric constant microelectronic dielectric material selected from the group consisting of organo functional spin-on-glass (SOG) dielectric materials, fluoro functional spin-on-glass (SOG) dielectric materials, organo functional spin-on-polymer (SOP) dielectric materials and fluoro functional spin-on-polymer (SOP) dielectric materials.

16. The method of claim 13 wherein the chemical mechanical polish (CMP) planarized patterned conductor layer is formed from a microelectronic conductor material selected from the group consisting of aluminum, aluminum alloys, copper and copper alloys.

17. The method of claim 13 wherein the at least one of the hydrophilic chemical mechanical polish (CMP) low dielectric constant dielectric substrate layer and the hydrophilic chemical mechanical polish (CMP) planarized patterned layer is formed incident to a radiation treatment of the at least one of the chemical mechanical polish (CMP) low dielectric constant dielectric substrate layer and the chemical mechanical polish (CMP) planarized patterned layer within an oxidizing atmosphere.

18. The method of claim 13 wherein first aqueous contact angle is a first deionized water sessile aqueous contact angle of greater than about 90 degrees and the second aqueous contact angle is a second deionized water sessile aqueous contact angle of less than about 90 degrees.

19. The method of claim 17 wherein the radiation treatment is selected from the group consisting of an ultraviolet radiation treatment, a plasma radiation treatment, an electron radiation treatment and an ion radiation treatment.

\* \* \* \* \*